United States Patent
Sambucco

(10) Patent No.: US 9,335,779 B2
(45) Date of Patent: May 10, 2016

(54) LINEAR HIGH SPEED TRACKING CURRENT SENSE SYSTEM WITH POSITIVE AND NEGATIVE CURRENT

(71) Applicant: Infineon Technologies Austria AG, Villach (DE)

(72) Inventor: Adriano Sambucco, Villach (AT)

(73) Assignee: Infineon Technologies Austria AG, Villach (AT)

( * ) Notice: Subject to any disclaimer, the term of this patent is extended or adjusted under 35 U.S.C. 154(b) by 240 days.

(21) Appl. No.: 14/206,816

(22) Filed: Mar. 12, 2014

(65) Prior Publication Data

US 2015/0261248 A1   Sep. 17, 2015

(51) Int. Cl.
*H02M 3/158* (2006.01)
*G05F 3/30* (2006.01)
*G01R 19/00* (2006.01)
*H02M 1/00* (2006.01)

(52) U.S. Cl.
CPC .............. *G05F 3/30* (2013.01); *G01R 19/0092* (2013.01); *H02M 2001/0009* (2013.01)

(58) Field of Classification Search
CPC .................... H02M 2001/0009; H02M 3/158; G01R 19/0092; G01R 19/0023
See application file for complete search history.

(56) References Cited

U.S. PATENT DOCUMENTS

2003/0173941 A1   9/2003   Harris et al.
2005/0035746 A1*  2/2005   Bernacchia ......... H02M 3/1588
                                        323/282
2005/0219926 A1* 10/2005   Tai ..................... H02M 3/1588
                                        365/207
2010/0277142 A1* 11/2010   Tan .................... H02M 7/53803
                                        323/268

FOREIGN PATENT DOCUMENTS

| CN | 1448819 A | 10/2003 |
| CN | 1717856 A | 1/2006 |
| CN | 1816964 A | 8/2006 |
| CN | 10166824 A | 3/2010 |
| DE | 10223977 C1 | 9/2003 |
| EP | 1432107 A2 | 6/2004 |
| WO | 2004051832 A1 | 6/2004 |
| WO | 2005004318 A1 | 1/2005 |

OTHER PUBLICATIONS

Shin, J-W, et al., "Bridgeless Isolated PFC Rectifier Using Bidirectional Switch and Dual Output Windings," IEEE Engergy Conversion Congress and Exposition (ECCE), Sep. 17-22, 2011, pp. 2879-2884.

* cited by examiner

*Primary Examiner* — Harry Behm
(74) *Attorney, Agent, or Firm* — Shumaker & Sieffert, P.A.

(57) ABSTRACT

In general, this disclosure describes linear tracking current sense systems having improved accuracy, bandwidth, and stability. An example device comprises a half bridge comprising a high side switch and a low side switch. The device further comprises a first second gain stage coupled to an operational transconductance amplifier (OTA) and the high side switch, wherein the first second gain stage is configured to sink or supply current to the high side switch from a first non-zero current. The device also comprises a second second gain stage coupled to the OTA and the low side switch, wherein the second second gain stage is configured to sink or supply current to the low side switch from a second non-zero current.

20 Claims, 5 Drawing Sheets

US 9,335,779 B2

LINEAR HIGH SPEED TRACKING CURRENT SENSE SYSTEM WITH POSITIVE AND NEGATIVE CURRENT

TECHNICAL FIELD

This disclosure is generally related to current sensing, and more particularly to current sensing in electronic circuitry including a half bridge configuration.

BACKGROUND

A tracking current sense circuit typically provides a copy of a current flowing in an active or passive device and may be used in applications such as DC-DC converters for server and mobile computer applications. Conventional tracking current sense systems often include an operational amplifier which results in a long settling time that limits the maximum frequency of the system. Conventional non-linear tracking current sense systems have inaccuracies and thus may not be suitable for some applications.

SUMMARY

In general, this disclosure describes tracking current sense systems having improved accuracy, bandwidth, and stability. Some example devices and systems described herein are linear. The example devices and systems include one or more operational transconductance amplifiers that, responsive to a side of a bridge turning on in a current operating phase, sink and supply current to that side of the bridge such that the current is approximately the same as an ending current in a previous operating phase. For example, a half bridge comprises a high side switch that operates during a $T_{ON}$ phase and a low side switch that operates during a $T_{OFF}$ phase. During a $T_{ON}$ phase, a current for the low side switch is pre-biased such that, at the beginning of a $T_{OFF}$ phase, the current starts at the current level reached at the end of a $T_{ON}$ phase. Similarly, the operational amplifiers sink and supply current to the high side switch during the $T_{OFF}$ phase such that, at the beginning of the $T_{ON}$ phase, a current for the high side switch starts at the current reached at the end of the $T_{OFF}$ phase. This pre-biases the current in a capacitance coupled to an inactive side of a half bridge such when that side of the half bridge becomes active, it is already close to or at an operating current. In this manner, pre-biasing the inactive side of a half bridge reduces any settling time for when that side of the half bridge is activated. Furthermore, this example tracking current sense system may work with positive and negative currents.

The details of one or more examples and techniques of this disclosure are set forth in the accompanying drawings and the description below. Other features, objects, and advantages of the disclosure will be apparent from the description and drawings, and from the claims.

BRIEF DESCRIPTION OF DRAWINGS

The drawings are not necessarily drawn to scale. Like reference numbers indicate like features, although variations between like features may exist in the various examples.

DETAILED DESCRIPTION

A current tracking system with one or more operational amplifiers may have limited bandwidth and slew rate due to one or more capacitors introduced to the system to stabilize the operational amplifiers. Thus, such a current tracking system may not be able to sink or to supply current with a speed that is required by the system because the current must be sunk or supplied from zero each time an operating phase changes (e.g., from $T_{ON}$ to $T_{OFF}$, or vice versa). This problem may introduce a systematic offset in the tracking current and, in some cases, the current tracking system may never even reach the tracking current when the active time is too short. Instead, no offset or very little offset when the system has settled may be preferred. In some applications, such as buck converters with fast switching, less time is available for settling amplifiers and tracking the current in a transistor. Furthermore, some non-linear current tracking systems may have an intrinsic inaccuracy due to continued switching. In some aspects, systems, devices, and techniques are described that have no or little offset and improved accuracy.

Figure 1:
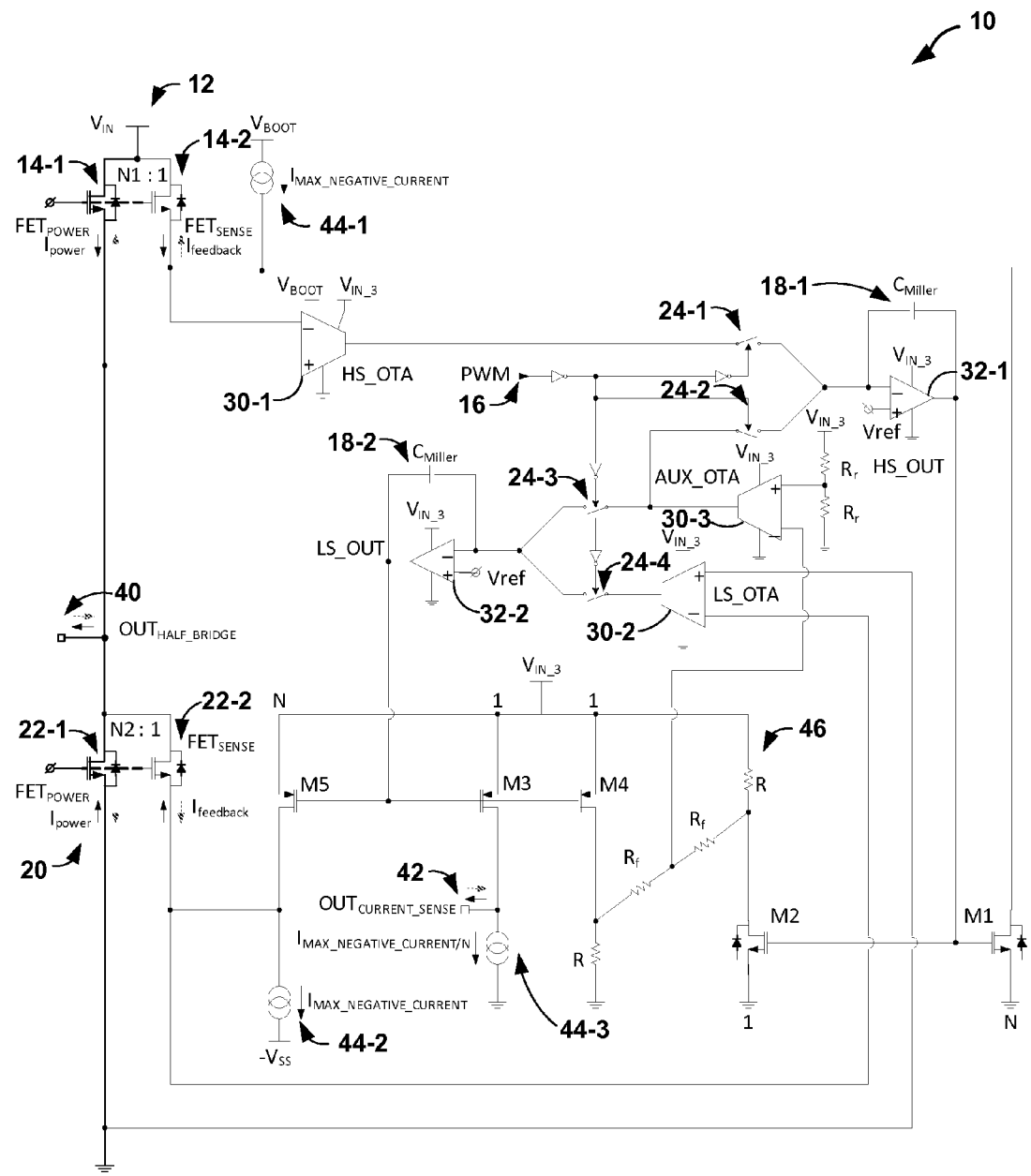
FIG. 1 is a schematic diagram illustrating an example tracking current sense system, in accordance with one or more techniques described in this disclosure.

FIG. 1 is a schematic diagram illustrating an example tracking current sense system 10, in accordance with one or more techniques described in this disclosure. Tracking current sense system 10 (also referred to herein as "system 10") is a linear system that maintains the accuracy performance of a linear system while also having the increased speed of a non-linear system. System 10 includes an operational transconductance amplifier ("OTA") 30-1 and a second gain stage 32-1. In combination, OTA 30-1 and second gain stage 32-1 act as a first operational amplifier. System 10 also includes an OTA 30-2 and a second gain stage 32-2. Likewise, in combination, OTA 30-2 and second gain stage 32-2 act as a second operational amplifier. Tracking current sense system 10 has a reduced settling time and is generally more accurate than conventional tracking current sense systems. In some examples, at least one of the second gain stages 32-1 and 32-3 may be included with an output stage.

Tracking current sense system 10 includes a half bridge including a high side switch 12 (referred to herein as "HS 12") and a low side switch 20 (referred to herein as "LS 20"). Tracking current sense system 10 is configured to track positive and negative currents that flow in both sides of the half bridge. System 10 may be able to track positive and negative current without any discontinuities. HS 12 includes a power field effect transistor ("FET") 14-1 and a sense FET 14-2, collectively referred to herein as "FETs 14." Sources of FETs 14 are coupled to operational transceiver amplifier 30-1 (also referred to herein as "HS_OTA 30-1") and second stage 32-1. A current $I_{power}$ flows through power FET 14-1. A current $I_{feedback}$ flows through sense FET 14-2. Similarly, LS 20 includes a power FET 22-1 and a sense FET 22-2, collectively referred to herein as "FETs 22." Sources of FETs 22 are coupled to OTA 30-2 (also referred to herein as "LS_OTA 30-2") and second stage 32-2. Current $I_{power}$ flow through power FET 22-1. Current $I_{feedback}$ flows through the source of sense FET 22-2.

In some examples, one or more of FETs 14 and 22 may comprise a metal oxide semiconductor field effect transistor ("MOSFET") transistor, for example, a P- or N-type MOSFET. In other examples, one or more of FETs 14 and 22 may comprise other types of transistors, such as a metal semiconductor field effect transistor ("MESFET"). As described herein for simplicity, HS 12 and LS 20 are described as comprising FETs 14 and 22, respectively. However, HS 12 and LS 20 may comprise one or more active or passive devices that are not FETs. For example, HS 12 and LS 20 may comprise other types of transistors, such as bipolar junction transistors, junction gate FETs, or the like. In another example, HS 12 and LS 20 may comprise one or more resistors, wherein a ratio of the resistors may be smaller for a power branch (i.e., corresponding to power FETs 14-1 and 22-1) and larger for the sense branch (i.e., corresponding to sense FETs 14-2 and 22-2). FIG. 1 illustrates an example where both HS 12 and LS 20 include two separate transistors (e.g., each switch is discrete). However, in other examples, either or both of HS 12 and LS 20 may have a monolithic transistor for the power and sense FETs (e.g., each switch is integrated). That is, system 10 may be fully discrete, fully integrated, or a mixture thereof.

HS_OTA 30-1 is used in system 10 instead of a high side comparator, as in other systems, which may include other non-linear systems. HS_OTA 30-1 is coupled to first second gain stage 32-1 (also referred to herein as "HS_OUT 32-1"). Together, HS_OTA 30-1 and HS_OUT 32-1 function similarly as an operational amplifier. An output of HS_OTA 30-1 drives HS_OUT 32-1. Similarly, LS_OTA 30-2 is used in system 10 instead of a low side comparator (which may be used, for example, in a non-linear system). LS_OTA 30-2 is coupled to second gain stage 32-2 (also referred to herein as "LS_OUT 32-2"). Together, LS_OTA 30-2 and LS_OUT 32-1 function similarly as an operational amplifier. An output of LS_OTA 30-2 drives LS_OUT 32-2.

A pulse width modulation (PWM) signal is input into system 10 at node 16. The PWM signal may function as a control signal for system 10. The PWM signal drives switches 24-1 through 24-4. In other examples, other types of control signals may be input into system 10 at node 16. For example, a pulse density modulation (PDM) signal may be input at node 16. In some examples, the PWM signal, or a signal similar to the PWM signal, drives system 10.

Tracking current sense system 10 further includes an auxiliary OTA 30-3. Auxiliary OTA 30-3 pairs with one of the second gain stages, HS_OUT 32-1 or LS_OUT 32-2, to pre-bias a side of system 10 that is currently inactive. For example, during the $T_{ON}$ operating phase, AUX_OTA 30-3 couples to LS_OUT 32-2 to pre-bias a current mirror comprising M5, M4, and M3 for a transition to the $T_{OFF}$ operating phase. Similarly, during the $T_{OFF}$ operating phase, AUX_OTA 30-3 couples to HS_OUT 32-1 to pre-bias a current mirror M1 and M2 for a transition to the $T_{ON}$ operating phase.

An output 40 ($OUT_{HALF\_BRIDGE}$) comprises an output of the half bridge where an inductive load may be connected. Another output 42 ($OUT_{CURRENT\_SENSE}$) is an output for tracking current sense system 10. Current in high side sense FET 14-2 or low side sense FET 22-2 may be determined by sampling the current at output 42.

Tracking current sense system 10 includes current sources 44-1 through 44-3 (collectively referred to herein as "current sources 44"). Current source 44-1 is coupled to the source of high side sense FET 14-2 and voltage $V_{BOOT}$. Current source 44-1 generates $I_{MAX\_NEGATIVE\_CURRENT}$. Current source 44-2 is coupled to voltage $-V_{55}$ and generates $I_{MAX\_NEGATIVE\_CURRENT}$. Current source 44-3 is coupled to ground and generates $I_{MAX\_NEGATIVE\_CURRENT/N}$. In some examples, the current N1 in HS 12 is approximately equal to the current N2 in LS 20. However, in some examples, N1 does not equal N2. If N1 does not equal N2, then system 10 may be trimmed such that N1 is closer to N2. Alternatively, two different values of $I_{MAX\_NEGATIVE\_CURRENT/N}$ for current source 44-3 may be used during $T_{ON}$ and $T_{OFF}$.

System 10 further includes transistors M1 through M5, some of which may function as current mirrors. Transistors M1 through M5 may be any suitable type of transistor, as described herein. A current mirror functions to approximately copy a current in another device. For example, transistor M2 may function as a current mirror for transistor M1. Transistor M4 may function as a current mirror for transistor M3 and M5. For example, when $T_{ON}$ is complete, LS_OUT 32-2 may use charge stored in capacitor 18-2 to pre-bias the current mirror M5, M4, and M3. The biasing voltage may be related to the last current that flowed in transistor M4, which is a copy of the current that flowed in transistor M2. Additionally, for example, when TOFF is complete, HS_OUT 32-1 may use charge stored in capacitor 18-1 to pre-bias the mirror M1 and M2. The biasing voltage may be related to the last current that flowed in transistor M2, which is a copy of the current that flowed in transistor M4. The current that flows in transistor M2 may be a copy of the current that flows in transistor M1, which may be a copy of the current $I_{POWER}$.

System 10 further includes resistor network 46. Resistor network 46 may include one or more resistors. For example, resistor network 46 includes four resistors having values of R or $R_f$. In some examples, resistor network 46 is coupled between a first current mirror (e.g., M1 and M2) and a second current mirror (e.g., M3, M4, and M5). For example, resistor network 46 may be coupled between transistor M2 and transistor M4. Resistor network 46 may be used to copy the current from M2 to M4, and vice-versa. For example, when the current that flows in M4 is approximately the same that flows in M2, the voltage drop through the resistors R is the same, and so the voltage drop is also the same through the resistors $R_f$. In other words, when the current in M4 is the same as the current in M2, node 47 (between the two resistors $R_f$) has approximately the same value as the reference voltage $V_{IN\_3}/2$. Resistor network 46 may be used to control the current instead of, for example, a simple connection between M4 and M2, because of the high output impedance of the current mirrors and the parasitic capacitance of AUX_OTA 30-3 input stage. In some examples, low resistor values for R and $R_f$ may be selected in order to move a pole out of the gain bandwidth product. Moreover, resistor network 46 provides some ability to trim the difference between N1 and N2.

Tracking current sense system 10 is configured to maintain a biasing of a current mirror connected to a part of the half bridge that is inactive with a current approximately equal to a current that flows in the part of the bridge that is active. In this way, when the operating phase changes (e.g., $T_{ON}/T_{OFF}$ or $T_{OFF}/T_{ON}$), no new set up of the operational amplifier on the newly operating side is required. Thus, the settling time becomes negligible. Systems and devices employing these techniques may be very cheap in terms of area and complexity (that is, lower than a non-linear system), and have the same performances of the non-linear system in terms of speed. Furthermore, systems and devices as described herein may have improved accuracy.

Figure 2:
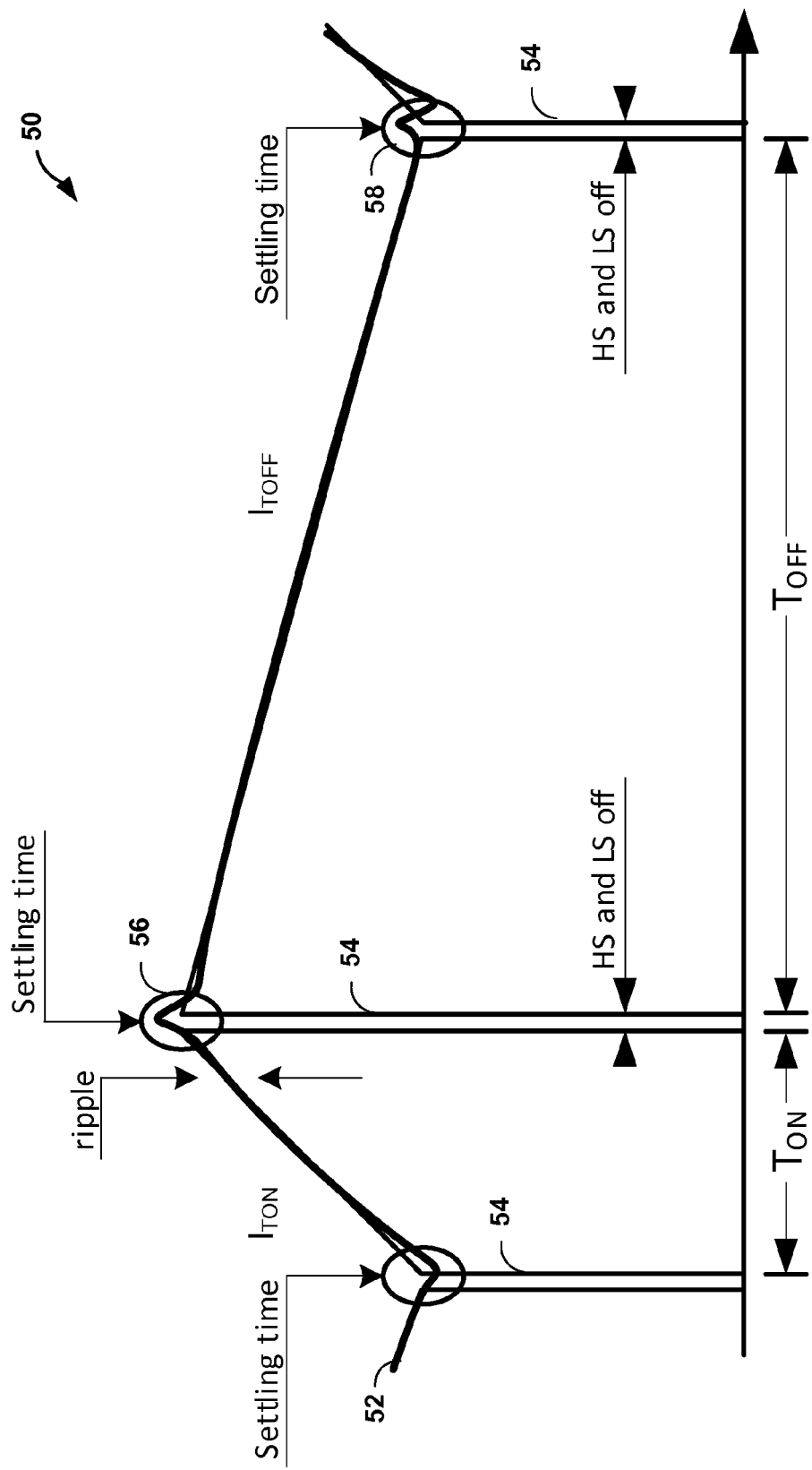
FIG. 2 is a timing diagram illustrating an example behavior of current in the tracking current system of FIG. 1, in accordance with one or more techniques described in this disclosure.

FIG. 2 is a timing diagram 50 illustrating an example behavior of current in tracking current sense system 10 of FIG. 1, in accordance with one or more techniques described in this disclosure. FIG. 2 illustrates a negligible settling time between different operating phases of system 10, $T_{ON}$ and $T_{OFF}$. That is, in FIG. 2, system 10 operates in $T_{ON}$, performs a hand over to operate in $T_{OFF}$, and then performs another hand over to operate in $T_{ON}$. During the $T_{ON}$ operating phases, HS 12 is powered on and active, while LS 20 is inactive. During the $T_{OFF}$ operating phase, LS 20 is powered on and active, while HS 12 is inactive. In the short time between $T_{ON}$ and $T_{OFF}$, both HS 12 and LS 20 are off.

Timing diagram 50 illustrates example real behavior of $I_{feedback}$, represented by curve 52 (referred to herein as "$I_{feedback}$ 52"). Curve 54 shows an ideal output current ($I_{power}/N$) for $I_{feedback}$. During the $T_{ON}$ phase, $I_{feedback}$ 52 ramps up. As shown at time 56, when $T_{ON}$ ends, $I_{feedback}$ 52 remains at about the same level as it was at the end of $T_{ON}$. In some examples, $I_{feedback}$ 52 may fluctuate up or down during time 56. When $T_{OFF}$ begins, $I_{feedback}$ 52 is close in value to the ideal output current 54. Thus, the settling time between $T_{ON}$ and $T_{OFF}$ is reduced in system 10 and may be negligible.

During $T_{OFF}$, $I_{feedback}$ 52 begins to drop. Once $T_{OFF}$ ends, during settling time 58, $I_{feedback}$ 52 remains at about the same level as it was at the end of $T_{OFF}$. In some examples, $I_{feedback}$ 52 may fluctuate up or down during time 58. Thus, when $T_{ON}$ begins again, $I_{feedback}$ 52 is close in value to the ideal output current 54. Thus, the settling time between $T_{OFF}$ and $T_{ON}$ is reduced in system 10 and may be negligible.

An example operation is described as follows. When the PWM signal at node 16 is high, HS 12 is powered on. When HS 12 is working, HS_OTA 30-1 and HS_OUT 32-1 function as a first operational amplifier that drives current in HS_FET$_{SENSE}$ 14-2. The current that flows in transistor M1 has a value approximately N times that of the current that flows in transistor M2. A second operational amplifier, made by AUX_OTA 30-3 and LS_OUT 32-2, function in order to have the current that flows in transistor M4 have approximately the same value as the current that flows in transistor M2. This may be, for example, because $V_{ref}$ is fixed at approximately $V_{IN\_3}/2$. When the $T_{ON}$ operating phase is finished and the $T_{OFF}$ operating phase begins, capacitor 18-2 (coupled to LS_OUT 32-2) holds a biasing voltage of the last current that flowed in transistor M4 (which is approximately the same as the current in transistor M2). This biasing voltage of capacitor 18-2 will ensure that the same current will flow in transistor M4 at the beginning of the $T_{OFF}$ operating phase. Thus, settling time 56 is reduced and may be negligible. An analogous operation occurs when the PWM signal at node 16 is low and LS 20 is powered on.

In order to have negligible settling time during transitions between operating phases, the gains of second gain stages HS_OUT 32-1 and LS_OUT 32-2 are high enough such that when the auxiliary OTA (AUX_OTA 30-3) changes its connection (e.g., from LS_OUT 32-2 to HS_OUT 32-1 for $T_{ON}$ to $T_{OFF}$, and from HS_OUT 32-1 to LS_OUT 32-2 for $T_{OFF}$ to $T_{ON}$), there is no appreciable voltage jump visible to the minus pins of second gain stages HS_OUT 32-1 and LS_OUT 32-2. The charge stored in capacitors 18-1 and 18-2 may maintain the bias of the mirrors during the blanking time (e.g., the times between $T_{ON}$ and $T_{OFF}$ when both HS FETs 14 and LS FETs 22 are off).

The systems and devices described herein may be good for using just a single sample point to measure the current during TON or TOFF, because the current, $I_{FEEDBACK}$, is much more stable, as shown in FIG. 2. The current, $I_{FEEDBACK}$, in conventional systems may have an oscillation or wave, resulting in a greater change of an inaccurate reading with single sample.

Figure 3:
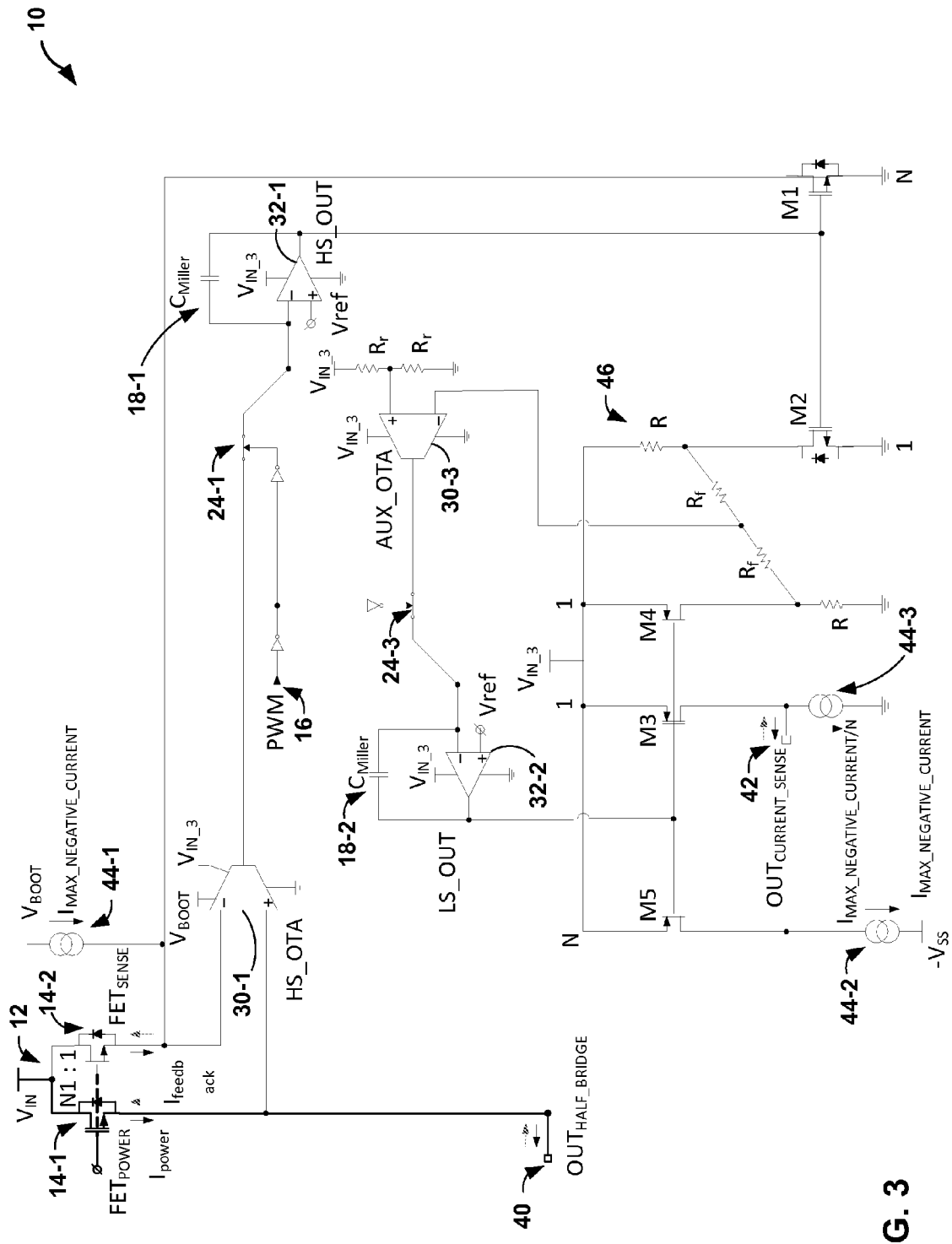
FIG. 3 is a schematic diagram illustrating the example tracking current sense system of FIG. 1 operating when a pulse width modulation (PWM) signal is high, in accordance with one or more techniques described in this disclosure.

FIG. 3 is a schematic diagram illustrating the example tracking current sense system 10 of FIG. 1 operating when a control signal, such as a PWM signal, is high, in accordance with one or more techniques described in this disclosure. In this example, those portions of system 10 that are inactive when the PWM signal at node 16 is high are not shown. That is, the part of the circuit of system 10 that is illustrated in FIG. 3 is the part of the circuit that contributes when the PWM signal is high.

When the PWM signal at node 16 is high, high side switch 12 is active and low side switch 20 is inactive (and thus LS 20 is not shown in FIG. 3). Because the PWM signal is high, switch 24-1 is closed. Thus, HS_OUT 32-1 receives, at the minus input, output from HS_OTA 30-1. HS_OTA 30-1 and HS_OUT 32-1 function together as an operational amplifier that drives the current in HS sense FET 14-2 (HS_FET$_{SENSE}$ 14-2) through the current mirror M1/M2. The current that flows in transistor M1 may be N times the current that flows in transistor M2 in this example. In other examples, other current values and ratios may be used.

Because the PWM signal is high, switch 24-3 is closed. Thus, LS_OUT 32-2 receives, at the minus input, output from auxiliary OTA 30-3 (AUX_OTA 30-3). LS_OUT 32-2 and AUX_OTA 30-3 function together as an operational amplifier that maintains the current in transistor M4 at approximately the same current that flows in transistor M2, because the reference voltage, $V_{ref}$, is fixed to approximately $V_{IN\_3}/2$. Thus, when the $T_{ON}$ phase is finished and the $T_{OFF}$ phase begins, capacitor 18-2 holds a biasing voltage related to the last current that flowed in transistor M4 (that is, approximately the same as the current in transistor M2) and will be the same that will flow in transistor M4 at the beginning of the $T_{OFF}$ phase. The current supplied to the output pin OUT$_{CURRENT\_SENSE}$ will be the same that will flow in the FET$_{SENSE}$ 14-2 scaled by factor N.

Thus, system 10 is a linear system that has both the performance of accuracy of linear systems at low frequency and the high answer speed of non-linear systems. This is because, both during $T_{ON}$ (for HS 12) and $T_{OFF}$ (for LS 20), the operational amplifiers sink or supply the current starting from the current reached at the end of the previous operating phase. System 10 includes three operational transconductance amplifiers (OTAs) and two low impedance second gain stages.

For example, system 10 includes a first operational transconductance amplifier, AUX_OTA 30-3, coupled to the high side switch 12 and to second gain stage, LS_OUT 32-2. Second gain stage 32-2 is configured to sink or supply current to the high side switch from a first non-zero current. Second gain stage 32-2 is further configured to supply current to high side switch 12 from the first non-zero current in response to half bridge 10 transitioning from operating in a $T_{OFF}$ phase to operating in a $T_{ON}$ phase, wherein the first non-zero current has a value approximately the same as a current reached in low side switch 20 at the end of the $T_{OFF}$ phase. For example, second gain stage 32-2, together with capacitor 18-2, holds a biasing voltage related to the last current that flowed in transistor M4 during the $T_{ON}$ phase such that it will be the same that will flow in transistor M4 at the beginning of the $T_{OFF}$ phase. In other words, responsive to $T_{OFF}$ ending, LS_OUT 32-2 and capacitor 18-2 stores the voltage bias equivalent to the last current that is flowing in current mirror M5/M4/M3 during $T_{OFF}$. When $T_{ON}$ starts, switches 24-1 and 24-3 are closed. HS_OTA 30-1 drives HS_OUT 32-1, and together they drive the mirror M1/M2. The current that flows in M1 is used to such that the sources of FETs 14-1 and 14-2 have approximately the same voltage. The current that flows in M2 (a scaled copy of the current in M1), is used as reference current for a current follower comprising AUX_OTA 30-3 and LS_OUT 32-2. The current follower drives the current mirror M5/M4/M3, in order to have a copy of the current that flows in M2, in M4. This current minus the current $I_{MAX\_NEGATIVE\_CURRENT}/N$ is the current that flows in output 42, which is a copy of the current that flows in FET 14-2 and so in FET 14-1 scaled. When $T_{ON}$ is finished but before $T_{OFF}$ begins, switches 24-3 and 24-1 may be open and minus pins of LS_OUT 32-2 and HS_OUT 32-1 will be floating, storing a voltage bias approximately equal to the last current that flowed in the two mirrors (M3/M4/M5 and M2/M1).

Figure 4:
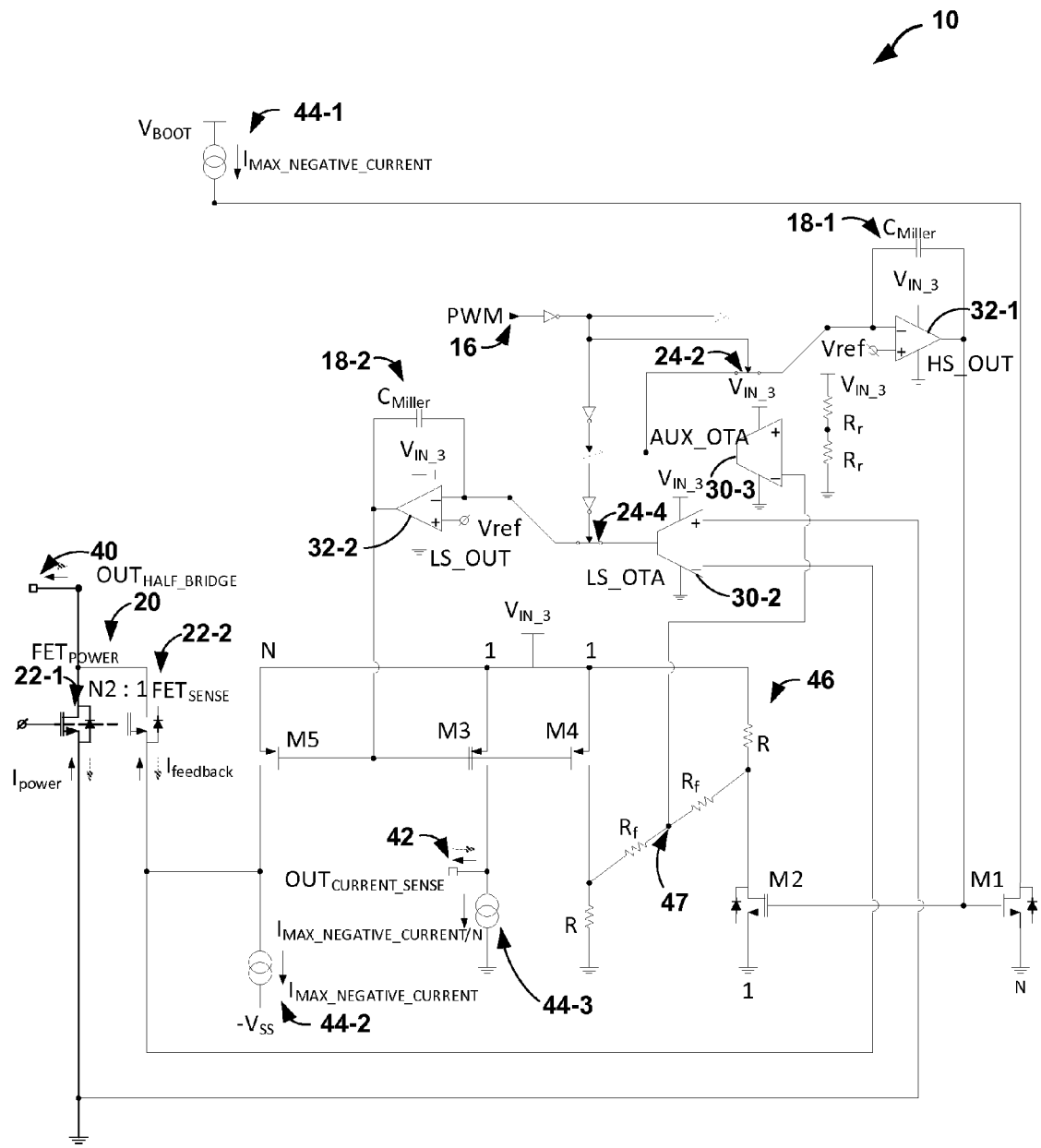
FIG. 4 is a schematic diagram illustrating the example tracking current sense system of FIG. 1 operating when the PWM signal is low, in accordance with one or more techniques described in this disclosure.

FIG. 4 is a schematic diagram illustrating the example tracking current sense system of FIG. 1 operating when the PWM signal is low, in accordance with one or more techniques described in this disclosure. In this example, those portions of system 10 that are inactive when the PWM signal at node 16 is low are not shown. That is, the part of the circuit of system 10 that is illustrated in FIG. 4 is the part of the circuit that contributes when the PWM signal is low.

When the PWM signal at node 16 is low, low side switch 20 is active and high side switch 12 is inactive (and thus HS 12 is not shown in FIG. 4). Because the PWM signal is low, switch 24-4 is closed. Thus, LS_OUT 32-2 receives, at the minus input, output from LS_OTA 30-2. LS_OTA 30-2 and LS_OUT 32-2 function together as an operational amplifier that drives the current in LS sense FET 22-2 (LS $FET_{SENSE}$ 22-2) through the current mirror M3/M4/M5. The current that flows in transistor M5 is N times the current that flows in transistors M4 and M3.

Furthermore, when the PWM signal is low, switch 24-2 is closed. Thus, HS_OUT 32-1 receives, at the minus input, output from AUX_OTA 30-3. HS_OUT 32-1 and AUX_OTA 30-3 function together as an operational amplifier that maintains the current in transistor M2 at approximately the same current that flows in transistor M4, because the reference voltage, $V_{ref}$, is fixed to approximately $V_{IN\_3}/2$. Thus, when the $T_{OFF}$ phase is finished and the $T_{ON}$ phase begins, capacitor 18-1 holds a biasing voltage related to the last current that flowed in transistor M2 (that is, approximately the same as the current in transistor M4) and will be the same that will flow in transistor M2 at the beginning of the $T_{ON}$ phase. The current supplied to the output pin $OUT_{CURRENT\_SENSE}$ will be the same that will flow in the $FET_{SENSE}$ 22-2 scaled by factor N.

Thus, system 10 comprises a linear system that has both the performance of accuracy of linear systems at low frequency and the high answer speed of non-linear systems. This is because, both during $T_{ON}$ (for HS 12) and $T_{OFF}$ (for LS 20), the operational amplifiers sink or supply the current starting from the current reached at the end of the previous operating phase. System 10 includes three operational transconductance amplifiers (OTAs) and two low impedance second gain stages.

For example, system 10 includes an operational transconductance amplifier, AUX_OTA 30-3, coupled to the low side switch 14 and to a second gain stage, HS_OUT 32-1. When TON is finished, first second gain stage 32-1, and in particular capacitor 18-1, is configured to store a voltage bias equivalent to the last current that is flowing in M1 and M2 during $T_{ON}$, which may result in the current in LS 20 starting $T_{OFF}$ having a first non-zero current. First second gain stage 32-1 is further configured to supply current to low side switch 20 from the second non-zero current in response to half bridge 10 transitioning from operating in a $T_{ON}$ phase to operating in a $T_{OFF}$ phase, wherein the second non-zero current has a value approximately the same as a current reached in low side switch 20 at the end of the $T_{OFF}$ phase. For example, second first second gain stage 32-1, together with capacitor 18-1, holds a biasing voltage related to the last current that flowed in transistor M2 during the $T_{OFF}$ phase such that it will be the same that will flow in transistor M2 at the beginning of the $T_{ON}$ phase. When $T_{OFF}$ starts, switches 24-2 and 24-4 are closed. LS_OTA 30-2 drives LS_OUT 32-2, and together they drive the current mirror M3/M4/M5. The current that flows in M5 may be used such that the sources of FETs 22-1 and 22-2 have approximately the same voltage. The current that flows in M4 may be used as reference current (e.g., scaled copy of M5) for a current follower comprising AUX_OTA 30-3 and HS_OUT 32-1. The current follower drives the current mirror M1/M2 in order to have a copy of the current that flows in M4, in M2. The current in M3, minus the current $I_{MAX\_NEGATIVE\_CURRENT}/N$, is the current that flows in output 42 that is a copy of the current that flows in FETs 22-2, thus the current in FET 22-1 is scaled. When $T_{OFF}$ finishes but before $T_{ON}$ begins, switches 24-2 and 24-4 are open and the minus pins of LS_OUT 32-2 and HS_OUT 32-1 will be floating storing a voltage bias approximately equivalent to the last current that is flowing in the two current mirrors.

Figure 5:
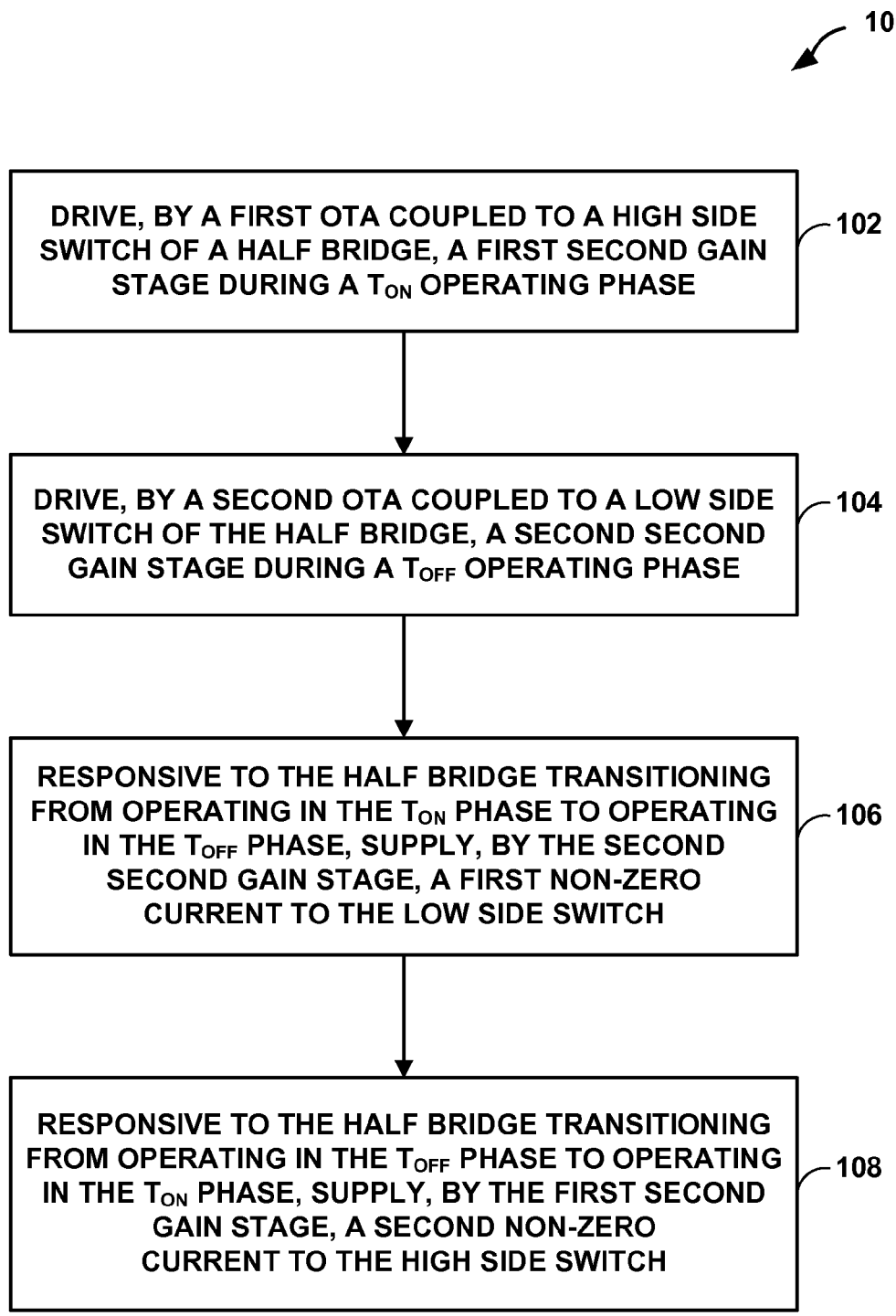
FIG. 5 is a flowchart illustrating an example method for operating a tracking current sense system, in accordance with one or more techniques described in this disclosure.

FIG. 5 is a flowchart illustrating an example method for operating a tracking current sense system, in accordance with one or more techniques described in this disclosure. The example method 100 may be employed to operate any of the devices and systems described in this disclosure, such as tracking current sense system 10 of FIGS. 1, 3, and 4. Method 100 may be used with other tracking current sense systems employing techniques described herein. For example, method 100 may be used with tracking current sense systems that have a full bridge.

Method 100 includes driving, by a first operational transconductance amplifier (OTA) coupled to a high side switch of a half bridge, a first second gain stage during a $T_{ON}$ operating phase (102). For example, HS_OTA 30-1 may be the first OTA and HS_OUT 32-1 may be the first second gain stage. HS_OTA 30-1 is coupled to HS switch 12 of half bridge 10 and drives HS_OUT 32-1 during the $T_{ON}$ operating phase.

Method 100 further includes driving, by a second OTA coupled to a low side switch of the half bridge, a second second gain stage during a $T_{OFF}$ operating phase (104). For example, LS_OTA 30-2 may be the second OTA and LS_OUT 32-2 may be the second second gain stage. LS_OTA 30-2 is coupled to LS switch 20 of half bridge 10 and drives LS_OUT 32-2 during the $T_{OFF}$ operating phase.

Method 100 further includes responsive to the half bridge transitioning from operating in the $T_{ON}$ phase to operating in the $T_{OFF}$ phase, supplying, by the second output gain stage, a first non-zero current to the low side switch (106). This may be done, as described above, in that when $T_{ON}$ is finished, capacitor 18-2 stores a voltage bias approximately equivalent to the last current that is flowing in M1 and M2 during $T_{ON}$. For example, responsive to system 10 transitioning between $T_{ON}$ and $T_{OFF}$, LS_OUT 32-2, using capacitor 18-2, supplies a first non-zero current to LS switch 20. In some examples, LS_OUT 32-2 supplies a current that is approximately the same as a current in transistor M4 to LS sense FET 22-2 during the transition between $T_{ON}$ and $T_{OFF}$.

Additionally, method 100 includes responsive to the half bridge transitioning from operating in the $T_{OFF}$ phase to operating in the $T_{ON}$ phase, supplying, by the first second gain stage, a second non-zero current to the high side switch (108). This may be done, as described above, in that when $T_{OFF}$ is finished, capacitor 18-1 stores a voltage bias approximately equivalent to the last current that is flowing in M3/M4/M5 during $T_{OFF}$. For example, responsive to system 10 transitioning between $T_{OFF}$ and $T_{ON}$, HS_OUT 32-1 supplies a first non-zero current to HS switch 12. In some examples, HS_OUT 32-1 supplies a current that is approximately the same as a current in transistor M2 to HS sense FET 14-2 during the transition between $T_{OFF}$ and $T_{ON}$.

Supplying, by the first output gain stage, the first non-zero current may be based at least in part on charge stored in a first capacitor coupled to the first output gain stage, to a sense transistor of the high side switch. Method 100 may further include maintaining the charge stored in the second capacitor such that a first gain in the first output gain stage is above a first threshold level. Capacitor 18-1 may be used to hold a charge related to the current in transistor M2. A designer may determine the first threshold level based on the configuration and application of system 10. In some examples, supplying the first non-zero current further comprises supplying the first non-zero current having a value approximately the same as a current reached at the end of the $T_{OFF}$ phase.

Supplying, by the second output gain stage, the second non-zero current may be based at least in part on charge stored in a second capacitor coupled to the second output gain stage, to a sense transistor of the low side switch. Method 100 may further include maintaining the charge stored in the second capacitor such that a second gain in the second output gain stage is above a second threshold level. Capacitor 18-2 may be used to hold a charge related to the current in transistor M4. A designer may determine the second threshold level based on the configuration and application of system 10. In some examples, supplying the second non-zero current further comprises supplying the second non-zero current having a value approximately the same as a current reached at the end of the $T_{oN}$ phase.

Method 100 may further comprise tracking one of a positive current or a negative current in the half bridge by sampling a current at an output of the half bridge.

In sum, tracking current sense system 10 may be configured to maintain a biasing of a current mirror connected to a part of the half bridge that is off with a current equal to the current that flows in the part of the bridge that is on. In this way, when the operating phase changes (e.g., $T_{ON}/T_{OFF}$ or $T_{OFF}/T_{ON}$), no new set up of the operational amplifier on the newly operating side is required. Thus, the settling time, that is the frequency limit for the linear analog system, becomes negligible. Systems and devices employing these techniques may be very cheap in terms of area and complexity (that is, lower than a non-linear system), and have the same performances of the non-linear system.

The examples described herein may be used in a wide array of applications. Such applications may include, for example, DC-DC converters, which may include buck converters such as desktop or server central processing unit ("CPU") core voltage ("Vcore") and non-Vcore buck converters, single-phase point-of-load ("POL") application, multiphase POL applications, and high power density voltage regulator modules ("VRM"). Further, some of the examples described herein may be used in CPU or graphics processing unit ("GPU") regulation in notebooks, desktop graphics cards, double data rate ("DDR") memory, or graphic memory. Some of the examples described herein may also be utilized in vehicle airbag systems. Further, the devices and technologies described herein may be used in any applications using half bridges or full bridges.

Various examples and techniques have been described. Aspects or features of examples described herein may be combined with any other aspect or feature described in another example. These described examples and other examples are within the scope of the following claims.

What is claimed is:

1. A device comprising:
   a half bridge comprising a high side switch and a low side switch;
   a first second gain stage coupled to an operational transconductance amplifier (OTA) and the high side switch, wherein the first second gain stage is configured to sink or supply current to the high side switch from a first non-zero current; and
   a second second gain stage coupled to the OTA and the low side switch, wherein the second second gain stage is configured to sink or supply current to the low side switch from a second non-zero current.

2. The device of claim 1, wherein the first second gain stage is further configured to supply current to the high side switch from the first non-zero current in response to the half bridge transitioning from operating in a $T_{OFF}$ phase to operating in a $T_{ON}$ phase, wherein the first non-zero current has a value approximately the same as a current reached in the low side switch at the end of the $T_{OFF}$ phase.

3. The device of claim 1, wherein the second second gain stage is further configured to supply current to the low side switch from the second non-zero current in response to the half bridge transitioning from operating in a $T_{ON}$ phase to operating in a $T_{OFF}$ phase, wherein the second non-zero current has a value approximately the same as a current reached in the high side switch at the end of the $T_{ON}$ phase.

4. The device of claim 1, wherein the OTA is a first OTA, the device further comprising:
   a second OTA coupled to the high side switch; and
   a third OTA coupled to the low side switch.

5. The device of claim 4, wherein the second OTA drives the first second gain stage during a $T_{ON}$ phase and the third OTA drives the second second gain stage during a $T_{OFF}$ phase.

6. The device of claim 1, further comprising:
   a first capacitor coupled to the first second gain stage, configured to store a first biasing voltage during a $T_{ON}$ phase; and
   a second capacitor coupled to the second second gain stage, configured to store a second biasing voltage during a $T_{OFF}$ phase.

7. The device of claim 1, further comprising:
   a first current mirror that approximately maintains a current level of a current in a sense transistor of one of the high side switch or the low side switch; and
   a second current mirror that approximately maintains a current level of the current in the first current mirror.

8. The device of claim 7, further comprising:
   a resistor network coupled between the first current mirror and the second current mirror.

9. A current tracking sense system comprising:
   a half bridge comprising a high side switch and a low side switch;
   a first operational transconductance amplifier (OTA) coupled to a first second gain stage, wherein the first OTA is coupled to the high side switch;
   a second OTA coupled to a second second gain stage, wherein the second OTA is coupled to the low side switch; and
   an auxiliary OTA configured to couple to one of the first second gain stage or the second second gain stage, wherein the auxiliary OTA sinks or supplies current to one of the high side switch or the low side switch based on an operating phase of the half bridge.

10. The current tracking sense system of claim 9, wherein the auxiliary OTA is further configured to couple to the first second gain stage during a $T_{OFF}$ operating phase and couple to the second second gain stage during a $T_{ON}$ operating phase.

11. The current tracking sense system of claim 10, wherein the first second gain stage is configured to supply a non-zero current to the high side switch in response to the half bridge transitioning from operating in the $T_{OFF}$ phase to operating in the $T_{ON}$ phase, wherein the first non-zero current has a value approximately the same as a current reached in the low side switch at the end of the $T_{OFF}$ phase.

12. The current tracking sense system of claim 10, wherein the second second gain stage is configured to supply a non-zero current to the low side switch in response to the half bridge transitioning from operating in the $T_{ON}$ phase to operating in the $T_{ON}$ phase, wherein the non-zero current has a value approximately the same as a current reached in the high side switch at the end of the $T_{ON}$ phase.

13. The current tracking sense system of claim 9, wherein the high side switch further comprises a high side power transistor and a high side sense transistor, and the low side switch further comprises a low side power transistor and a low side sense transistor.

14. The current tracking sense system of claim 9, wherein the first OTA drives the first second gain stage during a $T_{ON}$ phase and the second OTA drives the second second gain stage during a $T_{OFF}$ phase.

15. The current tracking sense system of claim 9, further comprising:
- a first capacitor coupled to the first second gain stage, configured to store a first biasing voltage during a $T_{ON}$ phase;
- a second capacitor coupled to the second second gain stage, configured to store a second biasing voltage during a $T_{OFF}$ phase;
- a first current mirror that approximately maintains a current level of a current in a sense transistor of one of the high side switch or the low side switch; and
- a second current mirror that approximately maintains a current level of the current in the first current mirror.

16. A method, comprising:
- driving, by a first operational transconductance amplifier (OTA) coupled to a high side switch of a half bridge, a first second gain stage during a $T_{ON}$ operating phase;
- driving, by a second OTA coupled to a low side switch of the half bridge, a second second gain stage during a $T_{OFF}$ operating phase;
- responsive to the half bridge transitioning from operating in the $T_{ON}$ phase to operating in the $T_{OFF}$ phase, supplying, by the second second gain stage, a first non-zero current to the low side switch; and
- responsive to the half bridge transitioning from operating in the $T_{OFF}$ phase to operating in the $T_{ON}$ phase, supplying, by the first second gain stage, a second non-zero current to the high side switch.

17. The method of claim 16, wherein:
- supplying, by the first second gain stage, the first non-zero current is based at least in part on charge stored in a first capacitor coupled to the first second gain stage, to a sense transistor of the high side switch, and
- supplying, by the second second gain stage, the second non-zero current is based at least in part on charge stored in a second capacitor coupled to the second second gain stage, to a sense transistor of the low side switch.

18. The method of claim 16, further comprising:
- maintaining the charge stored in the first capacitor such that a first gain in the first second gain stage is above a first threshold level; and
- maintaining the charge stored in the second capacitor such that a second gain in the second second gain stage is above a second threshold level.

19. The method of claim 16, wherein:
- supplying the first non-zero current further comprises supplying the first non-zero current having a value approximately the same as a current reached at the end of the $T_{OFF}$ phase, and
- supplying the second non-zero current further comprises supplying the second non-zero current having a value approximately the same as a current reached at the end of the $T_{ON}$ phase.

20. The method of claim 16, further comprising tracking one of a positive current or a negative current in the half bridge by sampling a current at an output of the half bridge.

* * * * *